United States Patent
Lee et al.

(10) Patent No.: US 9,477,013 B2
(45) Date of Patent: Oct. 25, 2016

(54) REFLECTIVE OPTICAL SOURCE DEVICE

(71) Applicant: ELECTRONICS AND TELECOMMUNICATIONS RESEARCH INSTITUTE, Daejeon (KR)

(72) Inventors: Dong Hun Lee, Daejeon (KR); Jong Sool Jeong, Daejeon (KR); Ki Soo Kim, Daejeon (KR); Hyun Soo Kim, Daejeon (KR); Mi Ran Park, Daejeon (KR); O Kyun Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 115 days.

(21) Appl. No.: 14/619,092

(22) Filed: Feb. 11, 2015

(65) Prior Publication Data
US 2015/0236473 A1    Aug. 20, 2015

(30) Foreign Application Priority Data

Feb. 17, 2014  (KR) ........................ 10-2014-0017899

(51) Int. Cl.
```
G02F 1/03       (2006.01)
G02F 1/07       (2006.01)
G02B 1/113      (2015.01)
G02B 6/14       (2006.01)
G02F 1/01       (2006.01)
G02F 1/017      (2006.01)
G02F 1/015      (2006.01)
H01S 5/026      (2006.01)
H01S 5/50       (2006.01)
```
(52) U.S. Cl.
CPC ................. *G02B 1/113* (2013.01); *G02B 6/14* (2013.01); *G02F 1/0102* (2013.01); *G02F 1/01708* (2013.01); *G02F 2001/0157* (2013.01); *H01S 5/0261* (2013.01); *H01S 5/0265* (2013.01); *H01S 5/50* (2013.01)

(58) Field of Classification Search
CPC .......... G02B 2006/12152; G02B 2006/12142; G02B 6/1228; G02B 6/4225; G02B 6/305
USPC .............................. 359/238, 333, 341.1, 344
See application file for complete search history.

(56) References Cited

U.S. PATENT DOCUMENTS

| | | |
|---|---|---|
| 2011/0150016 A1 | 6/2011 | Park et al. |
| 2012/0281274 A1 | 11/2012 | Kim et al. |
| 2012/0300802 A1 | 11/2012 | Kakui et al. |

FOREIGN PATENT DOCUMENTS

| | | |
|---|---|---|
| KR | 10-2011-0073232 A | 6/2011 |
| KR | 10-2012-0124548 A | 11/2012 |

OTHER PUBLICATIONS

Hyun-Soo Kim et al., "10 Gb/s REAM-SOA for Low Cost WDM-PON", Optical Fiber Communication Conference and Exposition and the National Fiber Optic Engineers Conference (OSA/OFC/NFOEC), pp. 1-3, Mar. 6-10, 2011.

Primary Examiner — Mahidere Sahle
(74) Attorney, Agent, or Firm — Rabin & Berdo, P.C.

(57) ABSTRACT

Disclosed is an optical source device. The optical source device includes: a mode converter configured to be optically coupled with an optical fiber; a semiconductor optical amplifier coupled with the mode converter, and configured to amplify an optical signal input through the optical fiber; and an electro absorption modulator coupled to the optical amplifier, and configured to modulate the amplified optical signal and output the modulated optical signal, in which each of the semiconductor optical amplifier and the optical absorption modulator includes a heater.

9 Claims, 5 Drawing Sheets

REFLECTIVE OPTICAL SOURCE DEVICE

CROSS-REFERENCE TO RELATED APPLICATION

This application is based on and claims priority from Korean Patent Application No. 10-2014-0017899, filed on Feb. 17, 2014, with the Korean Intellectual Property Office, the disclosure of which is incorporated herein in its entirety by reference.

BACKGROUND

1. Field

The present invention relates to an optical signal processing system, and more particularly, to an optical source device capable of high-speed modulating and long-distance transmitting an input optical signal.

2. Discussion of Related Art

In general, an injection type broadband optical source does not require a control of a wavelength of an optical source of an optical transmitter, and a manufacturing process of the optical source is simple, compared to a Wavelength Division Multiplexing-Passive Optical Network (WDM-PON) method using a non-injection type optical source, such as a wavelength tunable laser. Further, the injection type broadband optical source is relatively easy to implement a system, and establishment cost thereof is low, compared to the wavelength tunable laser.

A Reflective Electro Absorption Modulator integrated with Semiconductor Optical Amplifier (REAM-SOA) is one of the injection type broadband optical sources. The REAM-SOA has a structure in which an Electro Absorption Modulator (EAM) is monolithic integrated with a Semiconductor Optical Amplifier (SOA). Accordingly, in the REAM-SOA, the amplification of the optical signal is performed by the SOA, and the modulation is performed by the EAM, thereby increasing a transmission rate to be 10 Gbps or more.

Since a 3 dB gain bandwidth of the SOA is over the wavelength of 50 nm, the SOA is operable in a wide wavelength range with uniform gain characteristics.

Unlikely, the modulation characteristics of EAM is strongly depends on the wavelength difference between the band gap of EAM and the operation wavelength, so that it is difficult to obtain a uniform extinction ratio, low optical loss, and a low chirp property in a wide wavelength band. Accordingly, the EAM has a characteristic in that an operation wavelength band is relatively narrower than that of the SOA, so that the REAM-SOA has difficulty in efficiently amplifying and modulating a high-speed optical signal in a wide operation wavelength band.

In order to solve the disadvantage, an optical device having the same function may be manufactured by integrating a Mach-Zehnder Interferometer (MZI), but the optical device integrated with the MZI has a complex process, a low yield, and a relatively long length compared to the EAM. Accordingly, the optical device integrated with the MZI is not appropriate as a small and low cost broadband optical source.

Further, the EAM may perform high-speed and long-distance transmission for an input power of a wide range. However, in the SOA, a noise problem is generated in a low input power, and a signal distortion is generated by gain saturation in a high input power, so that the SOA has an input power dynamic range in which an optical signal can transmit with low transmission power penalty. Accordingly, the REAM-SOA device may transmit an optical signal with a high speed only in a specific input power range.

Accordingly, as an optical communication system becomes have a high speed and a large capacity, there is necessity for a broadband optical source, which has a uniform gain characteristic, extinction ratio, and chirp characteristic for an injection signal of a wide wavelength band, and is capable of increasing a branching ratio for configuring a low price system or performing high-speed and long-distance transmission even in a low injection optical signal.

SUMMARY

The present invention has been made in an effort to provide an optical source capable of high-speed and long-distance transmitting an input optical signal in a wide wavelength band and a wide input power range.

An exemplary embodiment of the present invention provides an optical source device, including: a mode converter configured to be optically coupled with an optical fiber; a semiconductor optical amplifier coupled with the mode converter, and configured to amplify an optical signal input through the optical fiber; and an electro absorption modulator coupled to the optical amplifier, and configured to modulate the amplified optical signal and output the modulated optical signal, in which each of the semiconductor optical amplifier and the optical absorption modulator includes a heater which controls a temperature.

In the present exemplary embodiment, the mode converter, the semiconductor optical amplifier, and the electro absorption modulator may be coupled by using a butt joint to be monolithically integrated.

In the present exemplary embodiment, the mode converter may include a waveguide in a form tilted with respect to the device facet in order to decrease the optical reflection at facet.

In the present exemplary embodiment, the semiconductor optical amplifier may include an optical amplification active layer, and the heater included in the semiconductor optical amplifier may adjust a carrier density of the optical amplification active layer through a control of a temperature of the optical amplification active layer.

In the present exemplary embodiment, a metal configuring the heater may be formed of a metal material having larger resistance than that of an electrode formed in the semiconductor optical amplifier, and the relatively large amount of heat compared to the amount of injected current.

In the present exemplary embodiment, the electro absorption modulator may include an Electro Absorption Modulation-Multi Quantum Well (EMW-MQW) the heater included in the electro absorption modulator may control a temperature of the EMW-MQW layer.

In the present exemplary embodiment, a metal configuring the heater may be formed of a metal material having larger resistance than that of an electrode formed in the electro absorption modulator, and the relatively large amount of heat compared to the amount of injected current.

In the present exemplary embodiment, the electro absorption modulator may have a form in which a polymer material is filled in both side surfaces of the deep ridge waveguide, and the polymer material may include at least one of Benzocyclobutene (BCB) or polyimide.

In the present exemplary embodiment, a front facet of the REAM-SOA may be anti-reflection coated, and a rear facet of the REAM-SOA may be high-reflectively coated, and the anti-reflection coating and the high-reflection coating may use at least one of titanium dioxide ($TiO_2$) and silicon dioxide ($SiO_2$).

According to the exemplary embodiment of the present invention, the optical source device controls a temperature of a local region by integrating the heater to each of the semiconductor optical amplifier and the electro absorption modulator, thereby adjust a gain characteristic of the semiconductor optical amplifier, and adjusts the band gap of the electro absorption modulator, thereby achieving a high-speed operation and a long-distance transmission for an input optical signal power in a wide wavelength band and a wide range.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, exemplary embodiments according to the present invention will be described in detail with reference to the accompanying drawings. In the description below, it should be noted that only parts necessary for understanding operations according to various exemplary embodiments of the present invention will be described, and descriptions of other parts may be omitted so as to avoid unnecessarily obscuring the subject matter of the present invention.

The present invention provides an optical source device capable of modulating and amplifying an optical signal of about 10 Gbps or more and long-distance transmitting the modulated and amplified optical signal without being dependent on a wavelength in an optical communication network, for example, a Wavelength Division Multiplexing-Passive Optical Network (WDM-PON). Here, the optical source device uses an injection type broadband optical source, so that it is not necessary to control a wavelength of an optical source, unlikely a non-injection type optical source.

Accordingly, in the present invention, a heater capable of independently adjusting a temperature is integrated in each of a semiconductor optical amplifier region and an electro absorption modulator region of a Reflective Electro Absorption Modulator integrated with Semiconductor Optical Amplifier (REAM-SOA). Further, the present invention provides an optical source device capable of high-speed and long-distance transmitting an input optical signal in a wide wavelength band and a wide input power range by controlling a gain of the semiconductor optical amplifier and a band gap of the electro absorption modulator with the integrated heaters, respectively.

Figure 1:
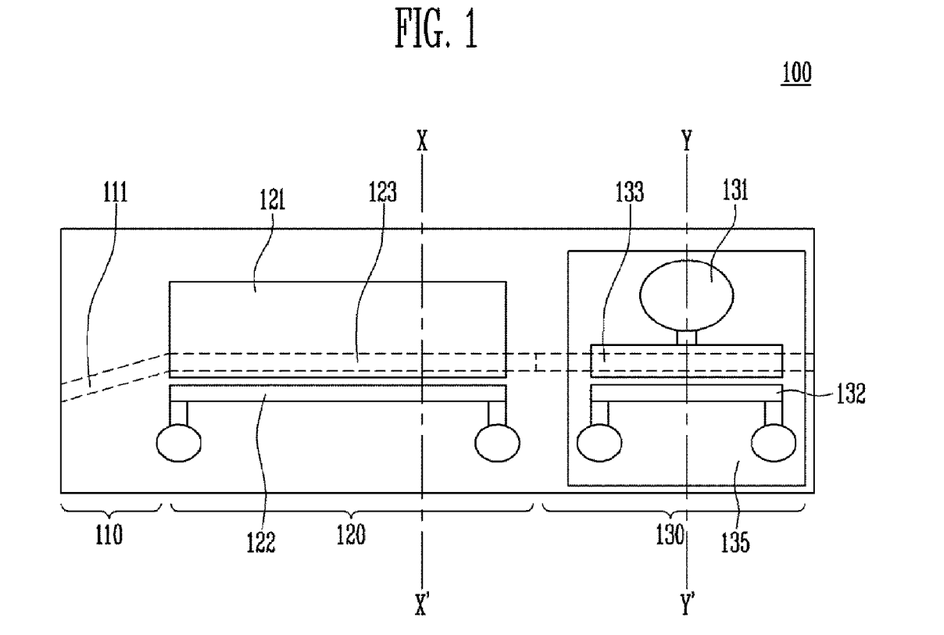
FIG. 1 is a diagram illustrating an optical source device according to an exemplary embodiment of the present invention.

FIG. 1 is a diagram illustrating an optical source device according to an exemplary embodiment of the present invention.

Referring to FIG. 1, an optical source device 100 includes a mode converter 110, a Semiconductor Optical Amplifier (SOA) 120, and an Electro Absorption Modulator (EAM) 130.

The mode converter 110 is optically coupled with an optical fiber. The mode converter 110 may decrease loss according to the coupling with the optical fiber. The mode converter 110 outputs an input optical signal to the SOA 120.

In this case, the mode converter 110 includes a waveguide 111 therein. In order to decrease an optical reflection, the waveguide 111 has a form tilted at a predetermined angle with respect to a surface of the waveguide 111 coupled with the SOA 120 (or a waveguide of the SOA 120).

The SOA 120 amplifies the input optical signal. The SOA 120 outputs the amplified optical signal to the EAM 130. The SOA 120 forms an optical amplification electrode 121 for injecting a current. The SOA 120 includes a heater (heater for the amplifier) 122 for controlling a temperature.

The EAM 130 modulates the amplified optical signal. The EAM 130 forms an electro absorption modulator electrode 131 for injecting a current. The EAM 130 includes a heater (heater for the modulator) 132 for controlling a temperature.

The optical signal reflected from a high-reflective coating surface is optically coupled with the optical fiber via the EAM 130, the SOA 120, and the mode converter 110 in a reverse direction again.

In the optical source device 100, the mode converter 110, the SOA 120, and the EAM 130 are monolithically integrated. Further, a front surface, for example a cross-section in a direction of the optical coupling with the optical fiber in the optical source device 100 is non-reflectively coated, and a rear surface, for example reflection surface of a region of the EAM 130 is high-reflectively coated. Here, one of titanium dioxide ($TiO_2$) and silicon dioxide ($SiO_2$) is used in the non-reflective coating and the high-reflective coating.

Further, wave guides 111, 123, and 133 included in the optical source device 100 are illustrated in a form of a dotted line.

The optical source device 100 independently controls temperatures of the SOA 120 and the EAM 130 by integrating the heaters in the SOA 120 and the EAM 130, respectively. Accordingly, the SOA 120 may control a gain, and the EAM 130 may control a band gap. Accordingly, the optical source device 100 may perform a high-speed operation and long-distance transmission for the input optical signal power for a wide wavelength band and a wide range.

Figure 2:
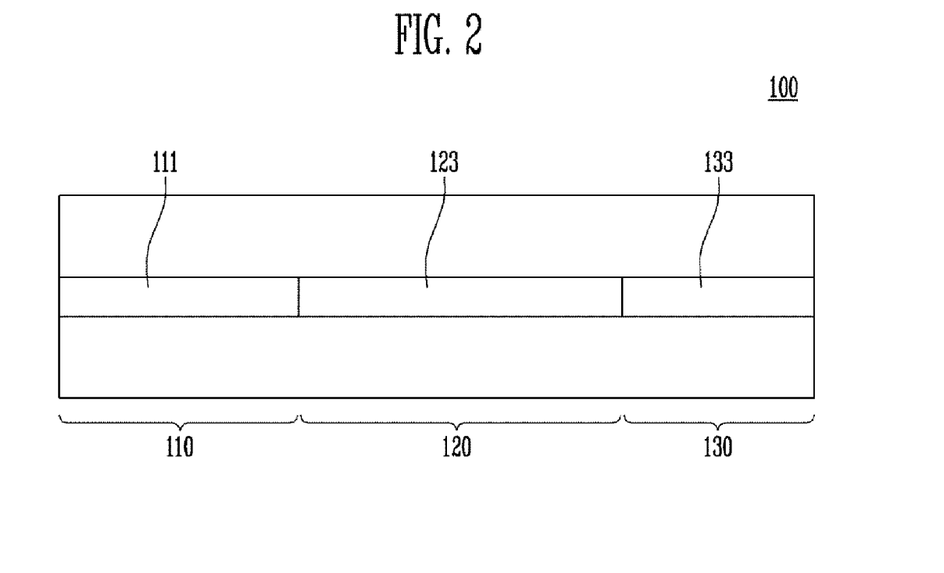
FIG. 2 is a diagram illustrating a lateral side of the optical source device according to the exemplary embodiment of the present invention.

FIG. 2 is a diagram illustrating a lateral side of the optical source device according to the exemplary embodiment of the present invention.

Referring to FIG. 2, the optical source device 100 has a structure in which the mode converter 110, the SOA 120, and the EAM 130 are monolithically integrated.

In this case, the mode converter 110 includes the passive waveguide 111, and the SOA 120 includes a semiconductor optical amplification active layer 123. The EAM 130 includes an Electro Absorption Modulation-Multi Quantum Well (EMW-MQW) layer 133.

The waveguide 101 formed of the passive waveguide 111, the semiconductor optical amplification active layer 123, and the EMW-MQW layer 133 is optically coupled in a butt joint method. Accordingly, the passive waveguide 111, the semiconductor optical amplification active layer 123, and the EMW-MQW layer 133 are monolithically integrated.

In this case, in order to minimize internal reflection, the optical source device 100 has a waveguide structure of minimizing a difference in an effective refractive index of each of the passive waveguide 111, the semiconductor optical amplification active layer 123, and the EMW-MQW layer 133. To this end, center positions of the passive waveguide 111, the semiconductor optical amplification active layer 123, and the EMW-MQW layer 133 configuring the waveguide 101 need to be manufactured with 0.2 μm and have reflectance of less than 10E-5 in a boundary interface of the butt joint.

Figure 3:
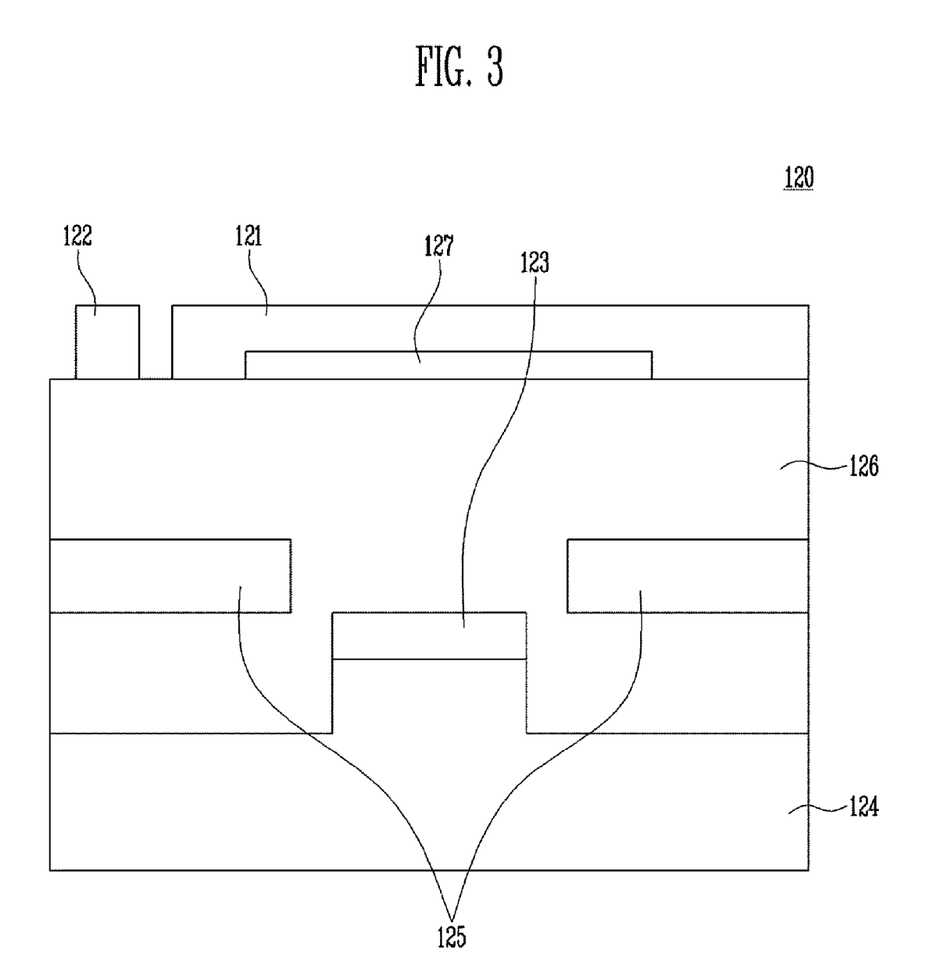
FIG. 3 is a diagram illustrating a cross-section of a semiconductor optical amplifier of the optical source device according to the exemplary embodiment of the present invention.

FIG. 3 is a diagram illustrating a cross-section of the semiconductor optical amplifier of the optical source device according to the exemplary embodiment of the present invention.

Referring to FIG. 3, the SOA 120 includes the semiconductor optical amplification electrode 121, the semiconductor optical amplification active layer 123, an n-InP substrate 124, an n-InP layer 125, a p-InP layer 126, and an InGaAs ohmic layer 127. Here, a cross-section of the SOA 120 is based on axis X-X' of FIG. 1.

The semiconductor optical amplification electrode 121 is a metal electrode having an excellent electrical property on the p-InP layer 126, which is a clad layer, and the InGaAs ohmic layer 127. The semiconductor optical amplification electrode 121 may be formed of a metal having an excellent electrical property, for example, titanium (Ti), platinum (Pt), and gold (Au). The semiconductor optical amplification electrode 121 injects a current to the p-InP layer 126.

The heater 122 for the optical amplifier applies heat to the semiconductor optical amplification active layer 123 under an external control. Accordingly, the heater 122 controls a temperature of the semiconductor optical amplification active layer 123. Accordingly, the metal electrode configuring the heater 122 is formed of a metal material, which has larger resistance than that of the electro absorption modulation electrode, and the relatively large amount of heat compared to the amount of injected current.

The semiconductor optical amplification active layer 123 is positioned on an upper portion of a protruding region of the n-InP substrate 124.

The n-InP substrate 124 has a partial region having a predetermined thickness and protruding from a center thereof.

The n-InP layers 125 are positioned between the p-InP layers 126, and positioned at both side surfaces of the semiconductor optical amplification active layer 123.

The p-InP layer 126, which is the clad layer, forms the n-InP layer 125 and a current blocking layer to decrease a leakage current flowing to the side of the semiconductor optical amplification active layer 123.

The InGaAs ohmic layer 127 is grown in a partial region of the upper portion of the p-InP layer 126, which is the clad layer.

The SOA 120 may control the temperature by using the integrated heater 122, thereby adjusting a gain characteristic by adjusting a carrier density of the semiconductor optical amplification active layer 123 of the SOA 120. It is possible to decrease a noise characteristic of the semiconductor optical amplifier by adjusting the gain characteristic of the SOA 120. Further, it is possible to adjust a saturated input power of the SOA 120, so that it is possible to transmit an optical signal for an input power of a wide range by adjusting an operation range for the power of the input optical signal.

Figure 4:
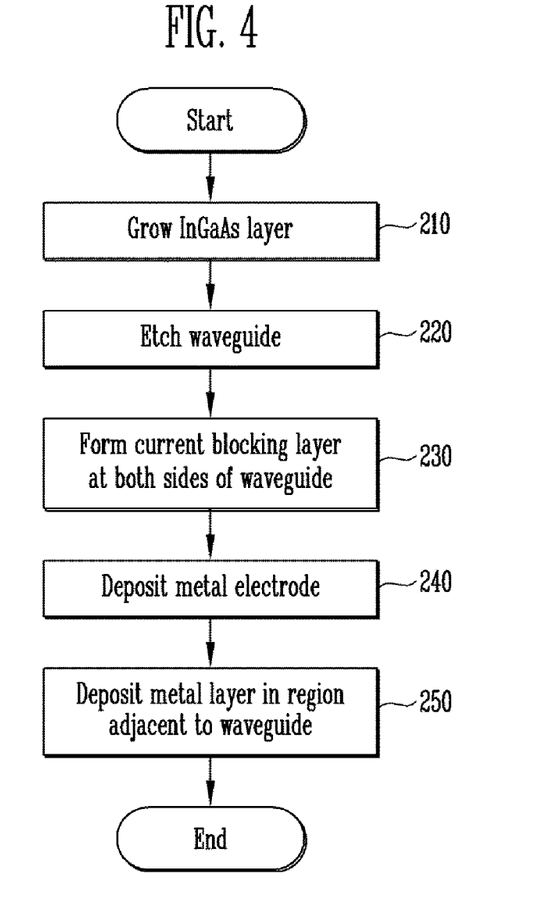
FIG. 4 is a flowchart illustrating an operation of generating the semiconductor optical amplifier of the optical source device according to the exemplary embodiment of the present invention.

FIG. 4 is a flowchart illustrating an operation of generating the semiconductor optical amplifier of the optical source device according to the exemplary embodiment of the present invention.

Referring to FIG. 4, in order to generate the SOA 120, a tensile strained bulk InGaAs layer having a polarization insensitive property is grown (step 210).

A waveguide, that is, the semiconductor optical amplification active layer 123, is etched by using Reactive Ion Etch (RIE) (step 220).

A current blocking layer is formed by using the p-InP layer 126 and the n-InP layer 125 at both sides of the etched waveguide (step 230).

In order to inject a current, a metal electrode, that is, the semiconductor optical amplification electrode 121, is deposited on the InGaAs ohmic layer 127 (step 240).

A metal layer having large electrical resistance is deposited in a region close to the waveguide (step 250). Accordingly, it is possible to independently control a temperature of the semiconductor optical amplifier.

Figure 5:
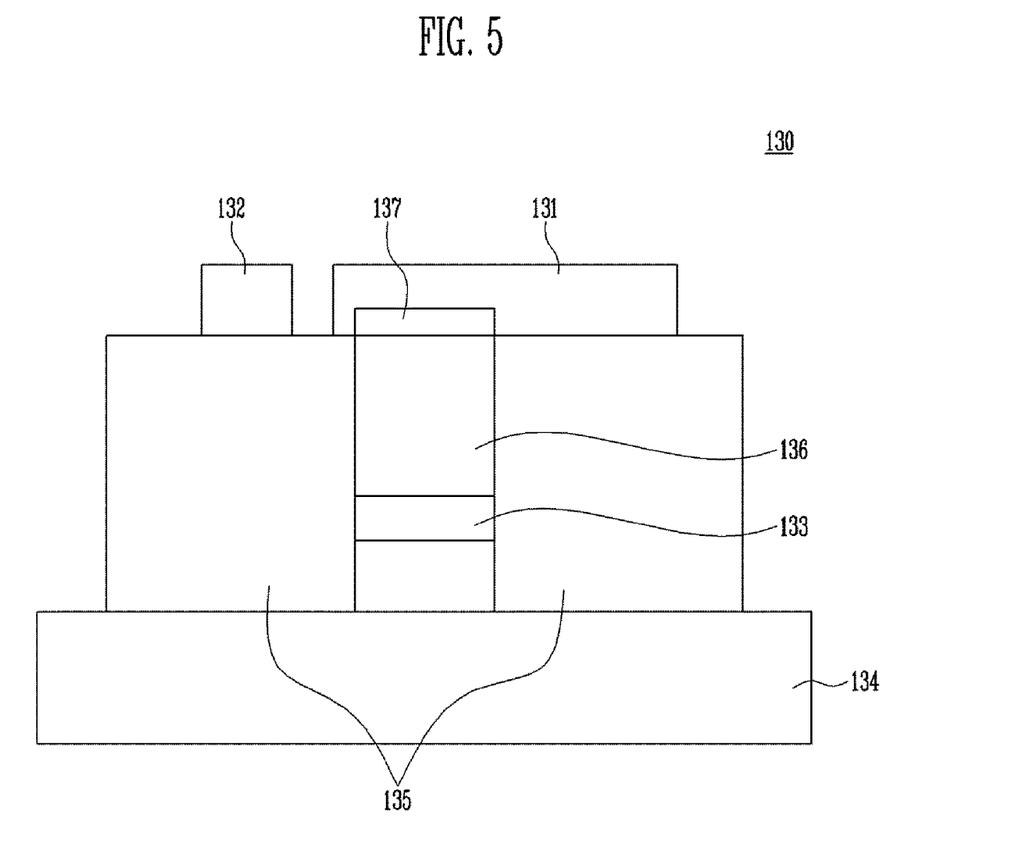
FIG. 5 is a diagram illustrating a cross-section of an electro absorption modulator of the optical source device according to the exemplary embodiment of the present invention.

FIG. 5 is a diagram illustrating a cross-section of the electro absorption modulator of the optical source device according to the exemplary embodiment of the present invention.

Referring to FIG. 5, the EAM 130 includes the electro absorption modulation electrode 131, the heater 132, the EAM-MQW layer 133, an n-InP substrate layer 134, a polymer layer 135, a p-InP layer 136, and an InGaAsP ohmic layer 137. Here, the cross-section of the EAM 130 is based on axis Y-Y' of FIG. 1.

The electro absorption modulation electrode 131 is positioned on the polymer layer 135 and the InGaAsP ohmic layer 137. The electro absorption modulation electrode 131 may be formed of a metal having an excellent electrical property, for example, titanium (Ti), platinum (Pt), and gold (Au).

The heater applies heat under an external control. The heater 132 controls a temperature of the EAM-MQW layer 133. Accordingly, the metal electrode configuring the heater 132 is formed of a metal material, which has larger resistance than that of the electro absorption modulation electrode, and the relatively large amount of heat compared to the amount of injected current.

The EAM-MQW layer 133 is formed between the p-InP layers 136 positioned on a partial region of the n-InP substrate layer 134.

The n-InP substrate layer 134 has a predetermined thickness, and the p-InP layer 136 and the polymer layers 135 positioned at both side surfaces of the p-InP layer 136 are positioned on the n-InP substrate layer 134.

The polymer layer 135 may be formed of a polymer-based material having a low dielectric constant, such as Benzocyclobutene (BCB) or polyimide. The polymer layer 135 is filled in both side surfaces of the deep ridge waveguide with a thickness of 2 μm or more.

The p-InP layer 136, which is the clad layer, is positioned between the polymer layers 135.

The InGaAsP ohmic layer 137 is grown on the p-InP layer 126, which is the clad layer.

The EAM 130 controls a temperature by using the integrated heater 132, thereby adjusting an absorption property for a wavelength by changing a band gap of the QAM-MQW layer 133. Accordingly, the EAM 130 may increase an extinction ratio according to an operation wavelength, decrease an optical loss property, and improve a chirp characteristic.

Figure 6:
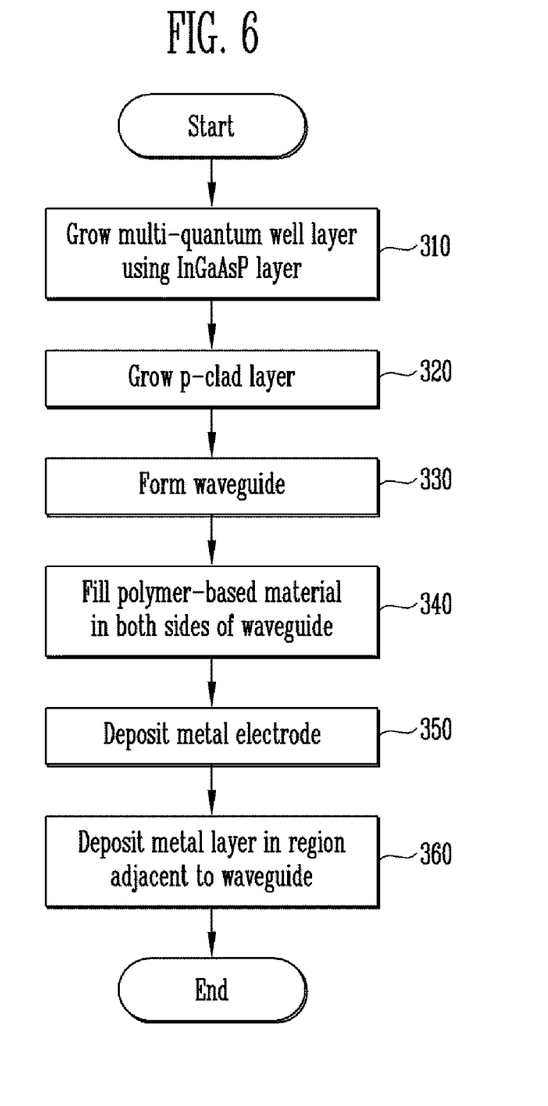
FIG. 6 is a flowchart illustrating an operation of generating the electro absorption modulator according to the exemplary embodiment of the present invention.

FIG. 6 is a flowchart illustrating an operation of generating the electro absorption modulator according to the exemplary embodiment of the present invention.

Referring to FIG. 6, in order to generate the EAM 130, an MQW layer using an InGaAsP well is grown in order to obtain an absorption property having low polarization sensitivity (step 310).

The p-clad layer, which is the clad layer, is grown on the MQW layer (step 320).

A waveguide is formed from a lower portion of the MQW layer to the bottom through etching (step 330). Here, an example of the etching may include Inductive Coupled Plasma (ICP) etching.

A polymer layer is formed by filling the polymer-based material in both side surfaces of the deep ridge waveguide (step 340).

A metal electrode is deposited on the deep ridge waveguide and the polymer layer (step 350). For example, titanium, platinum, or gold is deposited as the metal electrode.

A metal layer having large resistance, such as chrome (Cr) or a chrome alloy, is deposited on an upper surface of the polymer layer at a position adjacent to the deep ridge waveguide (step 360). Accordingly, only the EAM 130 may independently control a temperature.

In the meantime, in order to obtain a high gain characteristic and a low reflectance property, in the optical source device 100 suggested in the present invention, an input cross-section and an output cross-section of the mode converter 110 are coated with high reflectance of 0.1% or lower, and a reflection surface, on which the EAM 130 is positioned, is coated with high reflectance of 80% or more.

The optical source device 100 suggested in the present invention controls the temperatures of the SOA 120 and the EAM 130 by integrating the heaters in the semiconductor optical amplification region and the electro absorption modulation region. Accordingly, the optical source device 100 may perform a high-speed operation and long-distance transmission for an input optical signal power of a wide wavelength band a wide range.

This will be described in more detail. In a general REAM-SOA, a noise is generated at a low input power by the semiconductor optical amplifier, and a signal is distorted for a high input power, so that a transmission rate and a transmission distance are limited. The semiconductor optical amplifier integrated in the REAM-SOA has a gain band width of 3 dB of 50 nm or more, but optical absorption is generated in the electro absorption modulator, and a large absorption difference according to a wavelength is generated, so that there is a disadvantage in that the gain band width of the REAM-SOA is considerably decreased to be 3 dB or lower. Further, when the operation wavelength is moved to a long wavelength with the band gap in the multi-quantum well layer in the electro absorption modulator, an extinction ratio is decreased. When a driving voltage of the electro absorption modulator is increased in order to supplement the decrease of the extinction ratio, a modulation voltage is also increased.

Accordingly, this causes deterioration of a long-distance transmission characteristic of the optical signal according to the operation wavelength, and module manufacturing cost is increased in order to solve the deterioration of the long-distance transmission characteristic.

Accordingly, the optical source device of the present invention may locally control a temperature of the semiconductor optical amplification region, and adjust a gain characteristic of the optical source device by using the change in the temperature, so that it is possible to increase an operation range of the input power compared to the general REAM-SOA, thereby performing a high speed operation and long-distance transmission for input light of various intensities.

Further, the band gap in the quantum well layer in the electro absorption modulator has a characteristic of moving to a long wavelength by each 0.7 mm for a temperature change of 1° C. Accordingly, the optical source device of the present invention may locally heat the electro absorption modulator, thereby moving an absorption wavelength to a long wavelength. Accordingly, it is possible to adjust a gain wavelength of the optical source device, and control an extinction ratio, optical loss, and the chirp for a change in a wavelength, thereby achieving high-speed and long-distance transmission in a wide wavelength band.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. An optical source device, comprising:
a mode converter configured to be optically coupled with an optical fiber; a semiconductor optical amplifier coupled with the mode converter, and configured to amplify an optical signal input through the optical fiber; and
an electro absorption modulator coupled to the optical amplifier, and configured to modulate the amplified optical signal and output the modulated optical signal,
wherein each of the semiconductor optical amplifier and the electro absorption modulator includes a heater for controlling a temperature.

2. The optical source device of claim 1, wherein the mode converter, the semiconductor optical amplifier, and the electro absorption modulator are coupled by using a butt joint to be monolithically integrated.

3. The optical source device of claim 1, wherein the mode converter includes a waveguide in a form tilted with respect to a surface of the mode converter coupled with the optical amplifier in order to decrease an optical reflection.

4. The optical source device of claim 1, wherein the semiconductor optical amplifier includes an optical amplification active layer, and
the heater included in the semiconductor optical amplifier adjusts a carrier density of the optical amplification active layer through a control of a temperature of the optical amplification active layer.

5. The optical source device of claim 4, wherein a metal configuring the heater is formed of a metal material having larger resistance than that of an electrode formed in the semiconductor optical amplifier, and the relatively large amount of heat compared to the amount of injected current.

6. The optical source device of claim 1, wherein the electro absorption modulator includes an Electro Absorption Modulation-Multi Quantum Well (EMW-MQW)
- the heater included in the electro absorption modulator controls a temperature of the EMW-MQW layer.

7. The optical source device of claim 6, wherein a metal configuring the heater is formed of a metal material having larger resistance than that of an electrode formed in the electro absorption modulator, and the relatively large amount of heat compared to the amount of injected current.

8. The optical source device of claim 7, wherein the electro absorption modulator has a form in which a polymer material is filled in both side surfaces of the deep ridge waveguide, and
- the polymer material includes at least one of Benzocyclobutene (BCB) or polyimide.

9. The optical source device of claim 1, wherein a front surface of the electro absorption modulator are anti-reflectively coated, and a rear surface of the electro absorption modulator is high-reflectively coated, and
- the anti-reflection coating and the high-reflection coating use at least one of titanium dioxide ($TiO_2$) and silicon dioxide ($SiO_2$).

* * * * *